(12) United States Patent
Jen

(10) Patent No.: US 7,008,808 B2
(45) Date of Patent: Mar. 7, 2006

(54) METHOD OF MANUFACTURING LCOS SPACERS

(75) Inventor: Chung Kuei Jen, Bancieu (TW)

(73) Assignee: Taiwan Semiconductor Manufacturing Co Ltd, Hsin Chu (TW)

( * ) Notice: Subject to any disclaimer, the term of this patent is extended or adjusted under 35 U.S.C. 154(b) by 79 days.

(21) Appl. No.: 10/840,117

(22) Filed: May 5, 2004

(65) Prior Publication Data

US 2005/0250231 A1    Nov. 10, 2005

(51) Int. Cl.
*H01L 21/00* (2006.01)
*G02F 1/1339* (2006.01)

(52) U.S. Cl. .......................... 438/30; 438/48; 438/149; 349/155

(58) Field of Classification Search ............. 438/48, 438/30, 149, 152, 710, 22; 349/155
See application file for complete search history.

(56) References Cited

U.S. PATENT DOCUMENTS

| | | | | |
|---|---|---|---|---|
| 5,764,324 A | * | 6/1998 | Lu et al. ................. | 349/113 |
| 2002/0047967 A1 | * | 4/2002 | Jie et al. ................. | 349/113 |
| 2002/0149734 A1 | * | 10/2002 | Melnik et al. ............ | 349/156 |
| 2003/0076461 A1 | * | 4/2003 | Liu et al. ................. | 349/113 |
| 2003/0138982 A1 | * | 7/2003 | Wei et al. ................ | 438/30 |

* cited by examiner

*Primary Examiner*—Michael Trinh
(74) *Attorney, Agent, or Firm*—Tung & Associates

(57) ABSTRACT

A method for forming a liquid crystal on silicon (LCOS) display spacer and groove in a multi-step etching process including providing silicon substrate including a first overlying dielectric insulating layer and metal pixel electrodes; forming a second dielectric insulating layer over the metal pixel electrodes; forming a hardmask layer over the second dielectric insulating layer; photolithographically patterning a resist layer formed over the hardmask layer and plasma etching the hardmask layer to form an etching mask for etching spacers in the second dielectric insulating layer; carrying out a first plasma etching process to form spacers; removing remaining resist layer portions and polymer etching residues over the process surface; and, carrying out a second plasma etching process to etch grooves between metal pixel electrodes adjacent the spacers.

24 Claims, 2 Drawing Sheets

METHOD OF MANUFACTURING LCOS SPACERS

FIELD OF THE INVENTION

This invention generally relates to semiconductor device manufacturing methods and more particularly to a method for forming liquid crystal on silicon (LCOS) displays including a method for simultaneously defining an oxide spacer and groove separating pixel elements to improve the oxide spacer profile and avoid premature etch stop in groove etching thereby improving a fringe effect and increasing brightness of the display.

BACKGROUND OF THE INVENTION

Liquid crystal on silicon (LCOS) has become a common technology in forming portable displays having high resolution. LCOS uses liquid crystal contained between a rear plate comprising silicon and a front transmissive plate. Reflective pixels are formed in an upper portion of the rear plate typically representing a third or higher order metallization layer above a silicon substrate. The lower metallization layers typically formed in dielectric insulating layers represent circuitry between electrical elements such as transistors and capacitors formed in the silicon substrate and the front plates including transparent electrodes (indium-tin-oxide electrode) to control a Voltage applied to the various pixel electrodes defining a portion of display cells of the LCOS display. The polarization of the light passing through the liquid crystal contained in the display cells is modulated altering the alignment of the liquid crystal molecules which correspond to an applied Voltage to the display cells.

In one approach to forming display cells a groove is formed between each pixel electrode and spacers, also referred to as pillars are formed over a portion of adjacent pixel electrodes to define a display cell containing the liquid crystal. The profile of the spacers and depth and width of the grooves is critical display performance. For example the alignment of the liquid crystal molecules which determines light transmission or reflection is determined is affected by the angle of inclination of the spacers, affecting brightness and contrast of the display. In addition, an electric fringe field effect at the pixel electrode edges, which also affects orientation of the liquid crystal molecules, is dependent on the etching profile of the grooves, an irregular etching profile reducing the brightness of the display.

A problem in prior art LCOS display manufacturing methods includes the etching process to form the spacers and the grooves making up portions of the display cells. For example spacers are formed by etching through a relatively thick layer of oxide, typically about 1 micron or greater, using a patterned photoresist layer. As a result, the photoresist layer thickness has been critical in prior art processes since a photoresist layer that is too thick will result in an unacceptable spacer sidewall profile and a photoresist layer that is too thin will result in etching damage to the spacer. Moreover, according to prior art LCOS spacer formation processes, in dry etching the groove between pixel electrodes, the formation of metal containing polymeric etching residues frequently causes premature etch stop as the steady state build up of etching residues equal or exceeds material removal, resulting in grooves having undesirable profiles and depths.

There is therefore a need in the LCOS display manufacturing art to develop a manufacturing process whereby spacers and pixel edge grooves may be formed reliably with improved etching profiles to improve display performance including improving LCOS display brightness and contrast.

It is therefore among the objects of the present invention to provide a manufacturing process whereby spacers and pixel edge grooves may be formed reliably with improved etching profiles to improve display performance including improving LCOS display brightness and contrast, while overcoming other shortcomings of the prior art.

SUMMARY OF THE INVENTION

To achieve the foregoing and other objects, and in accordance with the purposes of the present invention, as embodied and broadly described herein, the present invention provides a method for forming a liquid crystal on silicon (LCOS) display spacer and groove in a multi-step etching process.

In a first embodiment, the method includes providing silicon substrate including a first overlying dielectric insulating layer and metal pixel electrodes; forming a second dielectric insulating layer over the metal pixel electrodes; forming a hardmask layer over the second dielectric insulating layer; photolithographically patterning a resist layer formed over the hardmask layer and plasma etching the hardmask layer and second dielectric insulating layer; carrying out a first plasma etching process to form spacers; removing remaining resist layer portions and polymer etching residues over the process surface; and, carrying out a second plasma etching process to etch grooves between metal pixel electrodes adjacent the pacers.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to formation of an exemplary LCOS display including exemplary pixel electrodes and spacers, it will be appreciated that the method of the present invention may be applied to pixel electrodes formed of different metals and to pixel electrodes and spacer elements having different sizes and spacer location arrangements.

For example, in an exemplary embodiment, referring to FIGS. 1A–1E, are shown cross sectional views of a portion of LCOS display rear panel including pixel electrodes and spacers at stages in a LCOS display manufacturing process.

Figure 1A:
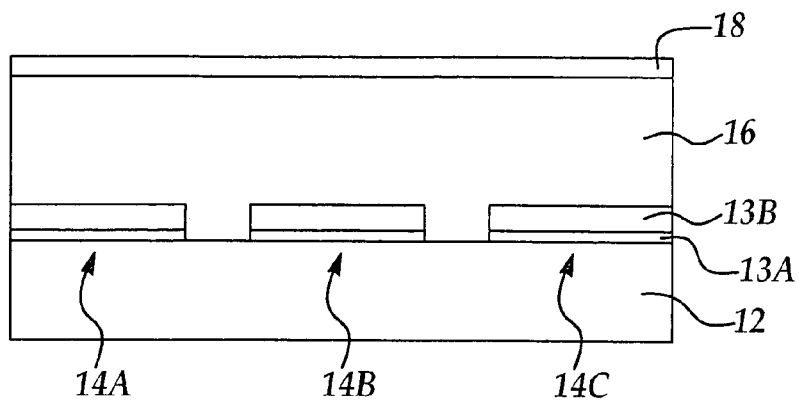
FIGS. 1A–1E are cross sectional views of a LCOS display rear panel at stages of manufacture according to an embodiment of the invention.

Referring to FIG. 1A, a first dielectric insulating layer 12 is formed over a substrate, for example including underlying dielectric layers and metallization layers overlying a silicon substrate with transistor elements formed therein. Preferably, the first dielectric insulating layer 12 is formed of silicon oxide, preferably formed by conventional plasma enhanced CVD (PECVD) or HDP-CVD oxide formation methods, more preferably a PECVD process, for example using silane ($SiH_4$) and an oxygen source such as $O_2$, $N_2O$, $CO_2$, or mixtures thereof, preferably at a thickness of from about 8000 Angstroms to about 12,000 Angstroms.

Pixel electrodes e.g., 14A, 14B, and 14C are then formed by conventional metal line formation processes. For example, in an exemplary embodiment, a barrier layer, preferably a refractory metal nitride or silicided refractory metal nitride such as TiN or TiSiN, preferably TiN for formation of an overlying AlCu metal layer, is first formed over dielectric insulating layer 12, for example deposited by a conventional CVD or PVD/nitridation process followed by deposition of an overlying reflective metal or metal alloy layer, for example AlCu, formed by conventional CVD and/or PVD processes to form a metallization layer. The metallization layer is then etched by conventional metal etching processes to form pixel electrodes e.g., 14A, 14B, and 14C including a reflective metal portion e.g., 13B and barrier layer portion e.g., 13A in each of the pixel electrodes. It will be appreciated that the pixel electrodes may be formed by a damascene process as well, for example including the barrier layer lining a damascene opening formed in the first dielectric insulating layer 12. It will also be appreciated that interconnect wiring, e.g., vias (not shown) are formed in the first dielectric insulating 12 layer including in lower metallization layers to electrically interconnect the pixel electrodes to underlying circuitry including transistors and capacitors (not shown) to apply a selected Voltage to a pixel electrode as is known in the art.

Still referring to FIG. 1A, a second dielectric insulating layer 16 is then formed over the pixel electrodes e.g., 14A, 14B, and 14C, including filling gaps between pixel electrodes, preferably formed of silicon oxide (e.g., $SiO_2$) formed by a PECVD or HDP-CVD process, more preferably a PECVD process in a similar manner as the first dielectric insulating layer 12, preferably at a thickness of from about 8000 Angstroms to about 12,000 Angstroms.

Still referring to FIG. 1A, in an important and critical aspect of the invention a silicon nitride layer (e.g., SiN) or silicon oxynitride (SiON) layer 18, more preferably SiN, is deposited as a hardmask layer over the second dielectric insulating layer 16 to a thickness of about 800 Angstroms to about 1200 Angstroms by an LPCVD or PECVD, more preferably a PECVD process.

Figure 1B:
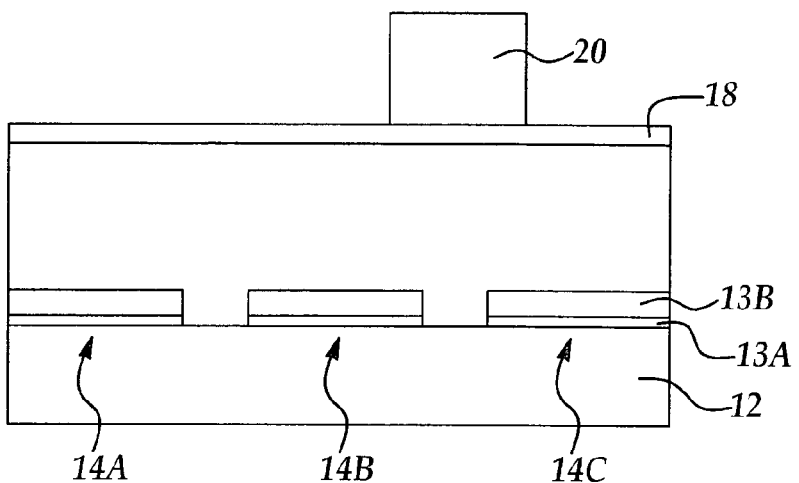

Referring to FIG. 1B, a photoresist layer is then deposited and patterned by conventional photolithographic methods to form a patterned resist portion 20 covering a portion of the hardmask layer 18 and underlying silicon oxide layer 16 for etching a spacer. It will be appreciated that spacers may be formed with varying distances between spacers and including one or more pixel electrodes between spacers.

In a preferred embodiment, the spacers are formed over corner portions of first pairs of pixel electrodes e.g., 14B and 14C with an adjacent groove as shown below formed separating at least one adjacent pixel electrode e.g., 14A, e.g., an adjacent groove separating every other first pair of pixel electrodes, together with a spacer formed over every other intervening second pair of pixel electrodes. Thus, in the preferred embodiment, the resist layer 20 is patterned to form a portion overlying a spacer to be etched spanning a first pair of pixel electrodes e.g., 14B and 14C.

Figure 1C:
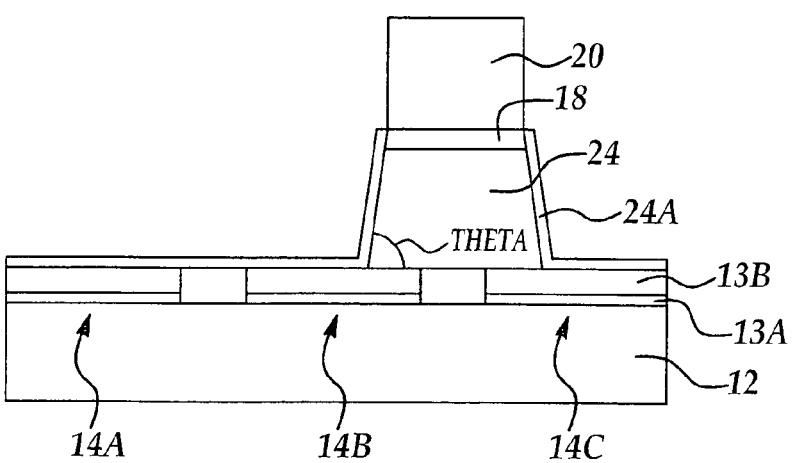

Referring to FIG. 1C, a conventional nitride etching chemistry, for example including fluorocarbons e.g., $CF_4$, oxygen ($O_2$) and nitrogen ($N_2$) is used to first etch through the hardmask layer 18, followed by an oxide etching chemistry, for example including a fluorocarbon and/or hydrofluorocarbon etching chemistry, more preferably hydrofluorocarbons, for example including $CHF_3$, $CH_2F_2$, $C_2H_2F_4$, $C_3H_2F_6$, $C_4H_2F_8$, and $C_5H_4F_8$, or mixtures thereof, preferably having a high polymer formation rate, e.g., a carbon to fluorine ration of greater than about ⅓. It will be appreciated that inert gases such as helium and argon may be added to the etching chemistry as well as oxygen to increase an oxide etch rate. For example, preferably, a sidewall passivation polymer layer e.g., 24A, is formed during etching through a thickness of the second PECVD oxide layer 16 to form a spacer 24 having sidewalls inclined at a desired angle, for example, the bottom portion of the spacer being wider than the top portion and the sidewalls having an angle, theta, between about 65 degrees and about 75 degrees with respect to a horizontal plane in the substrate.

Figure 1D:
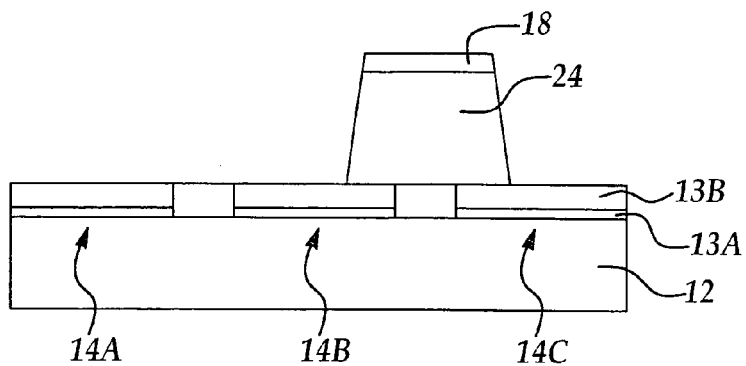

Referring to FIG. 1D, following etching of the oxide spacer 24, a remaining portion of the resist layer 20 and sidewall passivation polymer layer e.g., 24A formed during etching is removed by a conventional oxygen ashing and/or wet stripping process, preferably including a wet stripping process. Advantageously, according to the present invention, the thickness of the photoresist layer 20 does not have a limiting affect on spacer formation since the hardmask layer 18 protects the spacer from damage if the resist layer 20 is etched through prematurely.

Figure 1E:
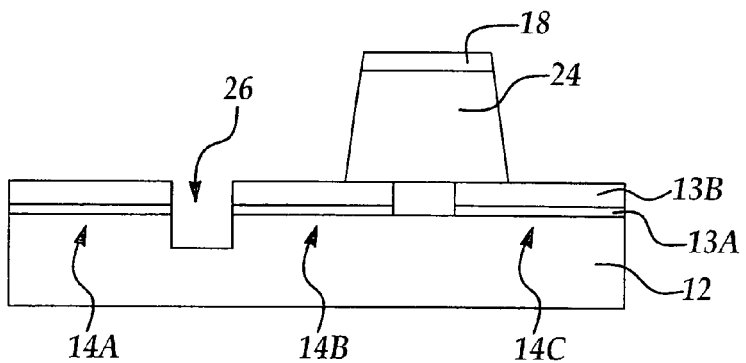

Referring to FIG. 1E, in a multi-step etching process, etching grooves e.g., 26 are then formed in a second etch process adjacent the spacer 24 between electrode portions 14A and 14B by etching into a predetermined depth of the first dielectric insulating layer 12. Optionally, the second etch process may be carried out in a second etcher optimized for etching high aspect ratio features, for example using a high density plasma and/or a dual plasma source (DPS) etcher. For example, the grooves e.g., 26 may be formed to a depth of about the same depth as the pixel electrode portions e.g., 14A and 14B, but are more preferably formed from to a depth deeper than the pixel electrodes, for example greater than the pixel electrode depth by about ½ to about the full depth of the pixel electrodes, for example having a depth of about 4000 to about 8000 Angstroms.

Preferably, to aid in the avoiding of premature etch stop during the groove (second) etching process due to polymer formation buildup, the oxide etching chemistry, which includes the same preferred embodiments for the spacer etching process, is interspersed at least once during the second etching process with an in-situ primarily oxygen containing plasma etch including an oxygen source gas flush for a brief period e.g., 1 second to 15 seconds, followed by resuming the oxide etching process. For example, a primarily oxygen (e.g., greater than 50 vol %) and optionally including argon, helium, and nitrogen plasma source gases are flushed into the etching chamber for a brief period of time to form a primarily oxygen containing etching chemistry to remove residual metal/polymer etching residues formed during the second etching process. The second etching process is then resumed by readjusting the etching chemistry to the previous oxide etching chemistry to continue etching the grooves, e.g., 26 to the desired depth. Advantageously, according to the present invention, removal of the polymer passivation layer and resist layer 20 following the spacer etching process helps to avoid premature etch stop in the second etching process to etch the grooves. Additionally, the hardmask layer 18 allows an in-situ oxygen etch to be performed to at least partially remove residual metal/polymer residues during the second etching process to prevent premature etch stop while avoiding etching damage to the upper portion of the spacer. Thus the method of the present invention allows both spacers and grooves to be formed with improved control over etching profiles and groove depths, avoiding damage to the spacer and avoiding premature etch stop in the groove. As a result, LCOS display performance is improved including improved contrast and brightness.

Figure 2:
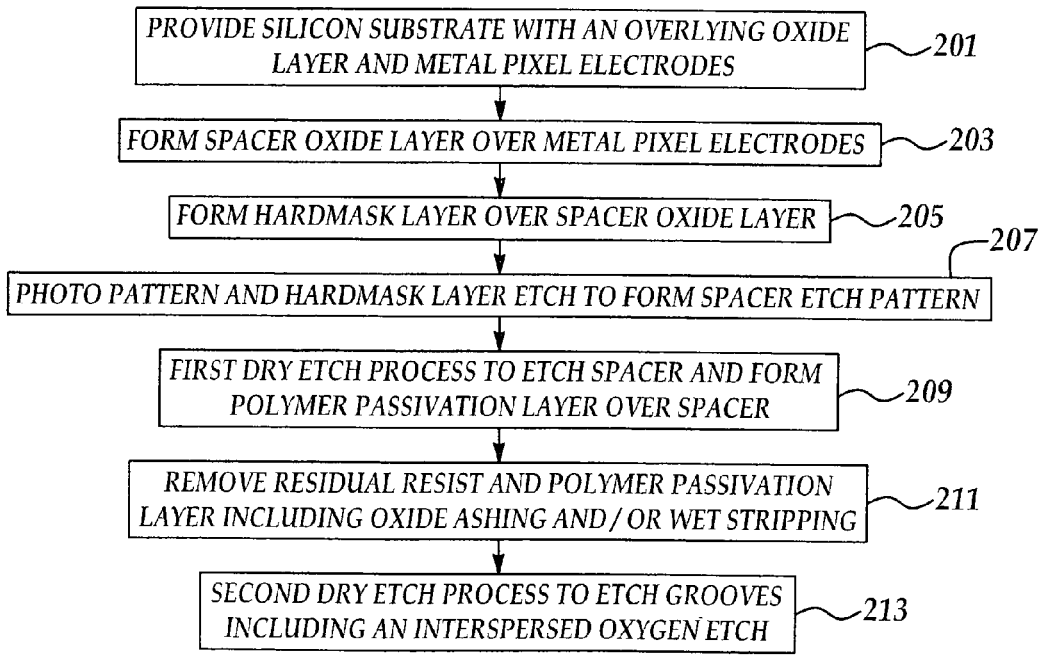
FIG. 2 is a process flow diagram including several embodiments of the present invention.

Referring to FIG. 2 is shown a process flow diagram including several embodiments of the present invention. In process 201, a silicon substrate including a first overlying dielectric layer and pixel electrodes for a LCOS display are provided. In process 203, a spacer oxide layer is formed over the pixel electrodes. In process 205, a hardmask layer is formed over the spacer oxide layer. In process 207, a photolithographic patterning and hardmask etching process is carried out to form a spacer etching pattern. In process 209, a spacer is etched in a first etching process including forming a polymer passivation layer over the process surface. In process 211, an oxide ashing and/or a wet stripping process is carried out to remove a remaining resist layer portion and the polymer passivation layer. In process 213, a second etching process is carried out to etch a groove including an interspersed (in-situ) primarily oxygen etch chemistry to at least partially remove metal/polymer etching residues followed by resuming groove etch.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a liquid crystal on silicon (LCOS) display spacer and groove in a multi-step etching process comprising the steps of:
   providing a silicon substrate comprising a first overlying dielectric insulating layer and metal pixel electrodes;
   forming a second dielectric insulating layer over the metal pixel electrodes;
   forming a hardmask layer over the second dielectric insulating layer;
   photolithographically patterning a resist layer formed over the hardmask layer and plasma etching the hardmask layer to form an etching mask for etching spacers in the second dielectric insulating layer;
   carrying out a first plasma etching process to form spacers;
   removing remaining resist layer portions and polymer etching residues over the process surface; and,
   carrying out a second plasma etching process to etch grooves between metal pixel electrodes adjacent the spacers.

2. The method of claim 1, wherein the hardmask layer is selected from the group consisting of silicon nitride and silicon oxynitride.

3. The method of claim 1, wherein the hardmask layer comprises silicon nitride formed by a CVD process selected form the group consisting of LPCVD and PECVD.

4. The method of claim 1, wherein the first and second dielectric insulating layers comprise silicon dioxide ($SiO_2$).

5. The method of claim 1, wherein the first and second dielectric insulating layers comprise silicon dioxide ($SiO_2$) formed by a PECVD process.

6. The method of claim 1, further comprising at least one of an in-situ primarily oxygen containing plasma etch performed at least once during the second plasma etching process.

7. The method of claim 1, wherein the first and second plasma etching chemistries comprises plasma source gases selected from the group consisting of fluorocarbons, hydrofluorocarbons, and oxygen.

8. The method of claim 1, wherein a polymer passivation layer is formed over the process surface following the first plasma etching process.

9. The method of claim 1, wherein the step of removing is selected from the group consisting of a wet stripping and oxygen ashing.

10. The method of claim 1, wherein the spacers are formed to span pairs of metal pixel electrodes.

11. The method of claim 1, wherein the grooves are formed between metal pixel electrodes comprising the pairs of metal pixel electrodes and an adjacent metal pixel electrode.

12. The method of claim 1, wherein the grooves are formed to a depth extending below the metal pixel electrodes.

13. The method of claim 1, wherein the height of the spacers is from about 8,000 Angstroms to about 12,000 angstroms.

14. The method of claim 1, wherein the metal pixel electrodes comprise an aluminum-copper alloy.

15. A method for forming a liquid crystal on silicon (LCOS) display spacer and groove in a multi-step etching process comprising the steps of:
   providing a silicon substrate comprising a first overlying silicon oxide layer and metal pixel electrodes;
   forming a second silicon oxide layer over the metal pixel electrodes;
   forming a hardmask layer comprising silicon nitride over the second silicon oxide layer;
   photolithographically patterning a resist layer and performing a first plasma etch process to form a spacer spanning a first pair of metal pixel electrodes including forming a polymer passivation layer over the spacer sidewalls;
   removing remaining resist layer portions and polymer passivation layer according to a wet etching process; and,
   carrying out a second plasma etching process to etch a groove into the first silicon oxide layer between a metal pixel electrode formed adjacent the first pair of metal pixel electrodes and the first pair of metal pixel electrodes.

16. The method of claim 15, further comprising an in-situ primarily oxygen containing plasma etch performed at least once during the second plasma etching process.

17. The method of claim 15, wherein the silicon nitride hardmask layer is formed by a CVD process selected form the group consisting of LPCVD and PECVD.

18. The method of claim 15, wherein the first and second silicon oxide layers comprise silicon dioxide ($SiO_2$) formed by a PECVD process.

19. The method of claim 15, wherein the first and second plasma etching chemistries comprises plasma source gases selected from the group consisting of fluorocarbons, hydrofluorocarbons, and oxygen.

20. The method of claim 15, wherein the groove is formed to a depth extending below the metal pixel electrodes.

21. The method of claim 20, wherein the groove is formed to a depth of from about 4000 to about 8000 Angstroms.

22. The method of claim 15, wherein the height of the spacer is from about 8,000 Angstroms to about 12,000 angstroms.

23. The method of claim 15, wherein the metal pixel electrodes comprise a TiN barrier layer and an aluminum-copper alloy.

24. The method of claim 15, wherein the spacer is formed having sidewall inclined at an angle between about 65 degrees and about 75 degrees with respect to a horizontal plane in the substrate.

* * * * *